(12) United States Patent
Tamura et al.

(10) Patent No.: US 12,744,192 B2
(45) Date of Patent: Sep. 22, 2026

(54) WAFER PLACEMENT TABLE INCLUDING A SPACE LAYER

(71) Applicant: NGK INSULATORS, LTD., Nagoya-City (JP)

(72) Inventors: Ryuji Tamura, Nagoya-City (JP); Ikuhisa Morioka, Handa-City (JP); Hiroya Sugimoto, Chiryu-City (JP); Keita Mine, Chita-District (JP)

(73) Assignee: NGK INSULATORS, LTD., Nagoya-City (JP)

( * ) Notice: Subject to any disclaimer, the term of this patent is extended or adjusted under 35 U.S.C. 154(b) by 587 days.

(21) Appl. No.: 18/307,918

(22) Filed: Apr. 27, 2023

(65) Prior Publication Data

US 2024/0162016 A1 May 16, 2024

Related U.S. Application Data

(63) Continuation of application No. PCT/JP2022/042044, filed on Nov. 11, 2022.

(51) Int. Cl.
*H01J 37/32* (2006.01)

(52) U.S. Cl.
CPC ... *H01J 37/32724* (2013.01); *H01J 2237/002* (2013.01)

(58) Field of Classification Search
CPC ...................... H01J 37/32724; H01J 2237/002
See application file for complete search history.

(56) References Cited

U.S. PATENT DOCUMENTS 6,558,508 B1 5/2003 Kawakami
2004/0063312 A1 4/2004 Strang et al.
2005/0068736 A1 3/2005 Moroz et al.
2010/0122774 A1* 5/2010 Makabe ............ H01J 37/32431 156/345.52
2018/0294197 A1 10/2018 Plano et al.
(Continued)

FOREIGN PATENT DOCUMENTS

JP H11-265931 A 9/1999
JP 2001-110885 A 4/2001
(Continued)

OTHER PUBLICATIONS

International Search Report and Written Opinion (Application No. PCT/JP2022/042044) dated Jan. 10, 2023.
(Continued)

*Primary Examiner* — Monica Lewis
*Assistant Examiner* — Jared Raymond Hausman
(74) *Attorney, Agent, or Firm* — Muncy, Geissler, Olds & Lowe, P.C.

(57) ABSTRACT

A wafer placement table includes a ceramic plate, a cooling plate, a space layer, and a space layer forming portion. The ceramic plate has a wafer placement portion at an upper surface of the ceramic plate and incorporates electrodes. The cooling plate is joined to a lower surface of the ceramic plate and has a refrigerant passage. The space layer is provided between the refrigerant passage and an upper surface of the cooling plate. The space layer forming portion is a part, surrounding the space layer, of the cooling plate. The space layer forming portion has a seam. The seam is formed by metal bonding without a seal member.

4 Claims, 8 Drawing Sheets

(56) References Cited

U.S. PATENT DOCUMENTS

| | | | | |
|---|---|---|---|---|
| 2021/0265141 | A1 | 8/2021 | Hayashi | |
| 2021/0358726 | A1 | 11/2021 | Ko et al. | |
| 2022/0189813 | A1 * | 6/2022 | Aikawa | H10P 72/722 |
| 2024/0304487 | A1 * | 9/2024 | Kwon | H10P 72/722 |

FOREIGN PATENT DOCUMENTS

| | | | | |
|---|---|---|---|---|
| JP | 2004-525513 | A | 8/2004 | |
| JP | 2010-123809 | A | 6/2010 | |
| JP | 4782682 | B2 | 9/2011 | |
| JP | 2015-035446 | A | 2/2015 | |
| JP | 2016-136552 | A | 7/2016 | |
| JP | 2019-140211 | A | 8/2019 | |
| JP | 6703646 | B2 | 6/2020 | |
| JP | 2021-180308 | A | 11/2021 | |
| WO | WO-2023277623 | A1 * | 1/2023 | H01L 21/67248 |

OTHER PUBLICATIONS

Korean Office Action (Application No. 10-2023-7015325) dated Aug. 13, 2024 (with English translation) (13 pages).
English translation of the International Preliminary Report on Patentability (Chapter I) dated May 22, 2025 (Application No. PCT/JP2022/042044).

* cited by examiner

WAFER PLACEMENT TABLE INCLUDING A SPACE LAYER

BACKGROUND OF THE INVENTION

1. Field of the Invention

The present invention relates to a wafer placement table.

2. Description of the Related Art

There has been known a wafer placement table including a ceramic plate and a cooling plate. The ceramic plate has a wafer placement portion at an upper surface thereof and incorporates an electrode. The cooling plate is disposed closer to a lower surface of the ceramic plate and has a refrigerant passage. Patent Literature 1 describes such a wafer placement table including a space layer (heat transfer layer) provided between a ceramic plate and a cooling plate. The space layer provides a heat transfer space that is located between the ceramic plate and the cooling plate and that accommodates a heat transfer fluid. The space layer is surrounded by an annular outer seal.

CITATION LIST

Patent Literature

PTL 1: JP 2021-180308 A

SUMMARY OF THE INVENTION

However, in Patent Literature 1, since the space layer is surrounded by the outer seal, the outer seal deteriorates when used for a long time, thus causing leakage of the heat transfer fluid in some cases.

The present invention is made to solve such a problem, and a main object of the present invention is to inhibit leakage of a fluid from a space layer.

[1] A wafer placement table of the present invention includes: a ceramic plate having a wafer placement portion at an upper surface of the ceramic plate and incorporating an electrode; a cooling plate joined to a lower surface of the ceramic plate and having a refrigerant passage; a space layer provided between the refrigerant passage and an upper surface of the cooling plate; and a space layer forming portion, surrounding the space layer, of the cooling plate. The space layer forming portion has a seam. The seam is formed by metal bonding without a seal member.

In the wafer placement table, the space layer forming portion, surrounding the space layer, of the cooling plate has the seam formed by metal bonding without a seal member. Thus, even when the wafer placement table is used for a long time, it is possible to inhibit leakage of a fluid from the seam of the space layer forming portion.

In the present description, the present invention may be described by using, for example, the terms up-down, left-right, and front-rear. However, the terms up-down, left-right, and front-rear merely represent relative positional relationships. Thus, when the orientation of the wafer placement table is changed, the up-down direction of the wafer placement table may be turned to a left-right direction, or the left-right direction of the wafer placement table may be turned to an up-down direction. Such cases are also included in the technical scope of the present invention. In addition, the "fluid" may be a gas or a liquid.

[2] In the above wafer placement table (wafer placement table according to [1] above), the space layer may cover a whole of the refrigerant passage in plan view. Thus, the cooling efficiency of the refrigerant passage is more easily controlled by using the space layer than that in a case in which the space layer covers a part of the refrigerant passage in plan view.

[3] In the above wafer placement table (wafer placement table according to [1] or [2] above), a plurality of columnar members connecting a ceiling surface and a bottom surface of the space layer forming portion may be provided in the space layer. In this manner, the thermal resistance of the space layer in an up-down direction is smaller than that in a case including no such columnar members, thus enabling heat of a wafer to be efficiently dissipated into the refrigerant passage.

[4] In the above wafer placement table (wafer placement table according to [3] above), hollow portions different from the space layer may be provided at respective positions in the cooling plate that are located directly above or directly below the columnar members. Since the columnar members connect the ceiling surface and the bottom surface of the space layer forming portion, respective parts of the wafer that are located directly above the columnar members may be cooled excessively. However, in this case, since the hollow portions different from the space layer are provided at the respective positions in the cooling plate that are located directly above or directly below the columnar members, the thermal insulation effect of the hollow portions is capable of inhibiting the respective parts of the wafer that are located directly above the columnar members from being cooled excessively.

[5] In the above wafer placement table (wafer placement table according to [1] or [2] above), a plurality of projecting portions whose height is smaller than a thickness of the space layer may be provided, in the space layer, on at least one of a ceiling surface or a bottom surface of the space layer forming portion. In this manner, the thermal resistance of the space layer in an up-down direction is smaller than that in a case including no such projecting portions, thus enabling heat of a wafer to be efficiently dissipated into the refrigerant passage. On the other hand, the projecting portions do not connect the ceiling surface and the bottom surface of the space layer forming portion. Thus, it is also possible to achieve a sufficient thermal insulation effect of the space layer having a vacuum atmosphere (including a depressurized atmosphere, the same applies hereinafter).

[6] The above wafer placement table (wafer placement table according to any one of [1] to [5] above) may further include a fluid switching mechanism connected to the space layer, the fluid switching mechanism being capable of switching between supply of a fluid to the space layer and discharge of the fluid from the space layer. In this manner, supply of a fluid to the space layer and discharge of the fluid from the space layer are switched, thus enabling a reduction and an increase in the thermal resistance of the space layer.

DETAILED DESCRIPTION OF THE INVENTION

Figure 1:
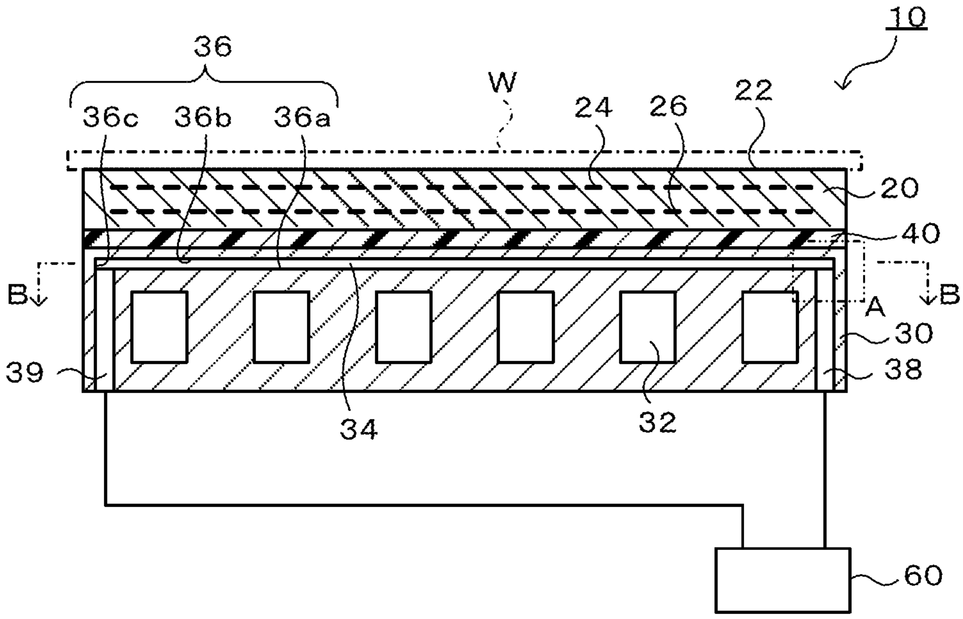
FIG. 1 is a vertical cross-sectional view of a wafer placement table 10.
Figure 2:
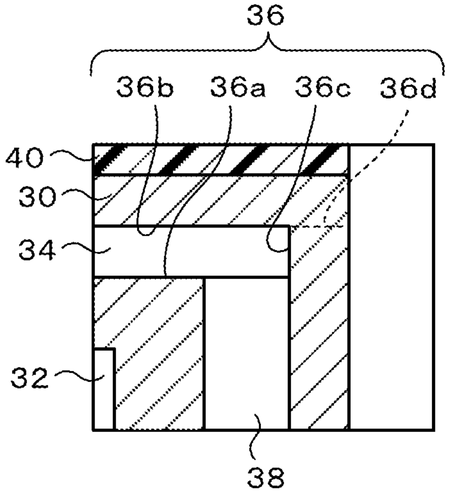
FIG. 2 is an enlarged view of a part A in FIG. 1.
Figure 3:
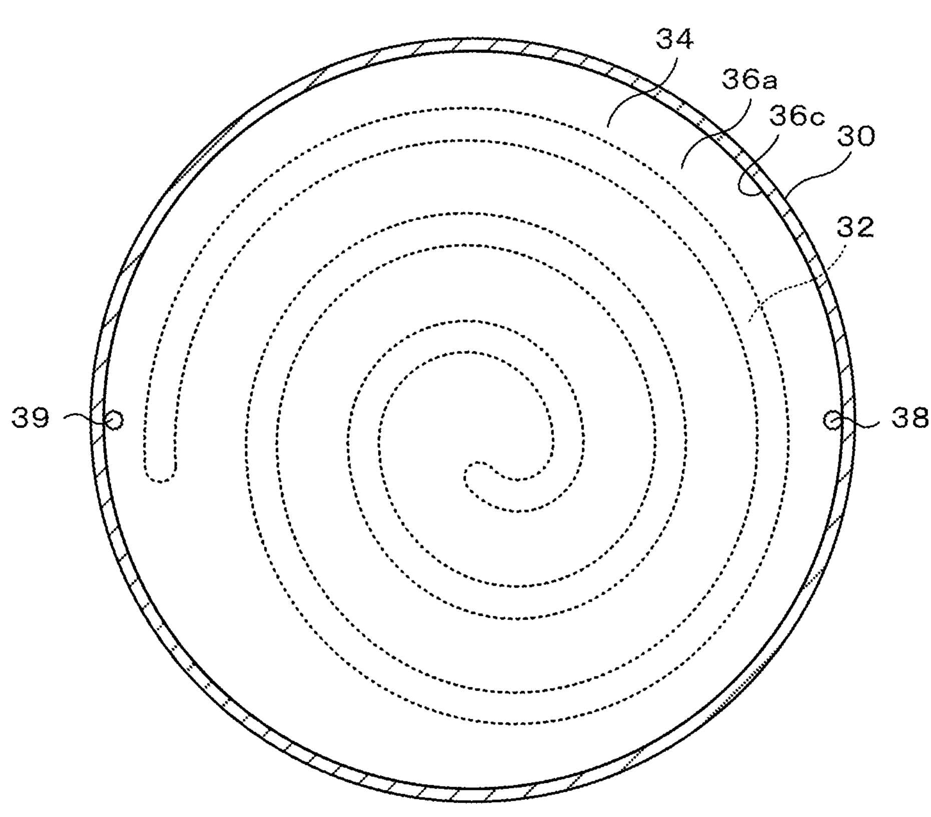
FIG. 3 is a sectional view taken along B-B in FIG. 1.

Hereinafter, a preferable embodiment of the present invention will be described with reference to drawings. FIG. 1 is a vertical cross-sectional view of a wafer placement table 10 (sectional view of the wafer placement table 10 taken along a plane including the central axis of the wafer placement table 10). FIG. 2 is an enlarged view of a part A in FIG. 1. FIG. 3 is a sectional view taken along B-B in FIG. 1.

The wafer placement table 10 is used for performing, for example, CVD or etching on a wafer W by using plasma. The wafer placement table 10 includes a ceramic plate 20, a cooling plate 30, and a joining layer 40.

The ceramic plate 20 is made of a ceramic material exemplified by, for example, alumina or aluminum nitride and has a wafer placement portion 22, which has a circular shape, at an upper surface thereof. The wafer W is placed on the wafer placement portion 22. Although not illustrated, a seal band is formed on the wafer placement portion 22 along the outer edge of the upper surface of the ceramic plate 20, and a plurality of small flat circular projections are formed on the entire surface of the wafer placement portion 22 inside the seal band. The seal band and each small circular projection have the same height that is, for example, several μm to several tens μm. An electrostatic electrode 24 and a heater electrode 26 are embedded in the ceramic plate 20.

The electrostatic electrode 24 is a flat mesh electrode embedded in a region corresponding to substantially the entire upper surface of the ceramic plate 20. Direct-current voltage can be applied to the electrostatic electrode 24. When a direct-current voltage is applied to the electrostatic electrode 24, the wafer W is attracted and fixed to the wafer placement portion 22 (specifically, an upper surface of the seal band and an upper surface of each small circular projection) with an electrostatic attractive force. When application of a direct-current voltage to the electrostatic electrode 24 is stopped, the wafer W attracted and fixed to the wafer placement portion 22 is released. The heater electrode 26 is a resistance heating element formed, in a one-stroke pattern from one end to the other end thereof, in a region corresponding to substantially the entire upper surface of the ceramic plate 20. Electric power can be supplied to the heater electrode 26 from a heater power source (not illustrated).

The cooling plate 30 is a disc member made of a metal exemplified by, for example, aluminum or aluminum alloy. The cooling plate 30 has a refrigerant passage 32, in which a refrigerant can circulate. The refrigerant passage 32 is formed, in a one-stroke pattern from one end (inlet) to the other end (outlet) thereof, in a region corresponding to substantially the entire upper surface of the ceramic plate 20. In the present embodiment, as illustrated in FIG. 3, the refrigerant passage 32 has a volute shape in plan view. A refrigerant is supplied to the one end (inlet) of the refrigerant passage 32 from a refrigerant circulating device (not illustrated), is discharged from the other end (outlet) of the refrigerant passage 32 through the refrigerant passage 32, and returns to the refrigerant circulating device. The refrigerant circulating device is capable of adjusting the temperature of a refrigerant to a desired temperature. The refrigerant is preferably a liquid, more preferably an electrical insulating liquid. Examples of such an electrical insulating liquid include a fluorine-based inert liquid.

The joining layer 40 joins a lower surface of the ceramic plate 20 and an upper surface of the cooling plate 30. In the present embodiment, the joining layer 40 is a resin adhesive layer. Examples of such a resin adhesive layer include one formed by holding, between the lower surface of the ceramic plate 20 and the upper surface of the cooling plate 30, an adhesive sheet having surfaces to which an organic adhesive is applied and by curing the adhesive sheet.

The cooling plate 30 has a space layer 34. The space layer 34 is provided between the refrigerant passage 32 and the upper surface of the cooling plate 30. The space layer 34 is provided so as to cover the whole of the refrigerant passage 32 in plan view. The part of the cooling plate 30 surrounding the space layer 34 is referred to as a space layer forming portion 36. The space layer forming portion 36 is formed by a bottom surface 36*a*, a ceiling surface 36*b*, and a side wall 36*c*. The bottom surface 36*a* and the ceiling surface 36*b* are circular surfaces in plan view. The side wall 36*c* is a cylindrical side surface. The thickness of the space layer 34 (distance between the bottom surface 36*a* and the ceiling surface 36*b*) is preferably 0.1 mm or more and 1 mm or less, more preferably 0.1 mm or more and 0.2 mm or less. A gas supply passage 38 and a gas discharge passage 39 are provided in the cooling plate 30 so as to extend from a lower surface of the cooling plate 30 to the bottom surface 36*a* of the space layer forming portion 36. The gas supply passage 38 is a passage through which a gas is supplied to the space layer 34. The gas discharge passage 39 is a passage through which a gas in the space layer 34 is discharged. The numbers of the gas supply passages 38 and the gas discharge passages 39 provided in the present embodiment are one each. The gas supply passage 38 and the gas discharge passage 39 are connected to a fluid switching mechanism 60.

As illustrated in FIG. 2, the space layer forming portion 36 has a seam 36*d*. The seam 36*d* is the boundary between the ceiling surface 36*b* and the top of the side wall 36*c*. The seam 36*d* is formed by metal bonding without a seal member such as an O-ring. Examples of such metal bonding include welding, soldering, diffusion bonding, and thermal compression bonding (TCB). TCB is a publicly known method in which two members to be joined between which a metal binder is held are pressure-bonded in a state of being heated to a temperature lower than or equal to the solidus temperature of the metal binder.

The fluid switching mechanism 60 supplies a gas (for example, a heat conductive gas such as a helium gas) to the space layer 34 via the gas supply passage 38 and discharges the gas in the space layer 34 via the gas discharge passage 39. The fluid switching mechanism 60 supplies a gas to the space layer 34 through the gas supply passage 38 and then closes the gas supply passage 38 and the gas discharge passage 39, thus enabling the gas to be filled in the space layer 34. In addition, the fluid switching mechanism 60 discharges a gas through the gas discharge passage 39 in a state in which the gas supply passage 38 is closed, thus enabling the space layer 34 to have a vacuum atmosphere.

Furthermore, the fluid switching mechanism 60 continues to supply a gas to the space layer 34 through the gas supply passage 38 and continues to discharge the gas through the gas discharge passage 39, thus enabling the gas to flow in the space layer 34.

Figure 4A:
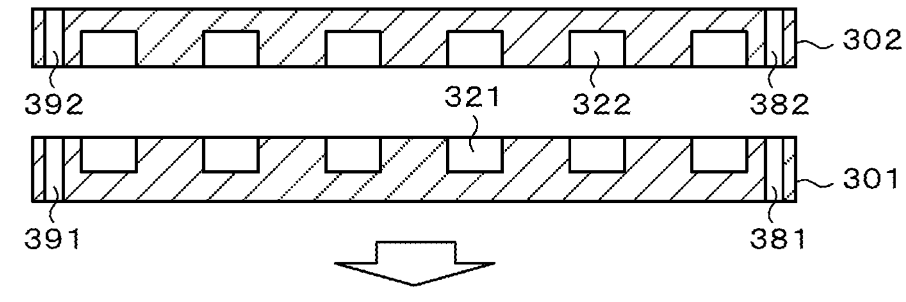
FIGS. 4A to 4E illustrate manufacturing processes of a cooling plate 30.

Next, an example of manufacturing the cooling plate 30 of the wafer placement table 10 will be described with reference to FIGS. 4A to 4E. First, a first cooling plate layer 301, which is a metal disc, is prepared, and a refrigerant passage groove 321 is formed in an upper surface of the first cooling plate layer 301. In addition, two through holes 381 and 391, which pass through the first cooling plate layer 301 in the thickness direction, are formed (FIG. 4A). Simultaneously, a second cooling plate layer 302, which is a metal disc, is prepared, and a refrigerant passage groove 322 is formed in a lower surface of the second cooling plate layer 302. In addition, two through holes 382 and 392, which pass through the second cooling plate layer 302 in the thickness direction, are formed (FIG. 4A).

Figure 4B:
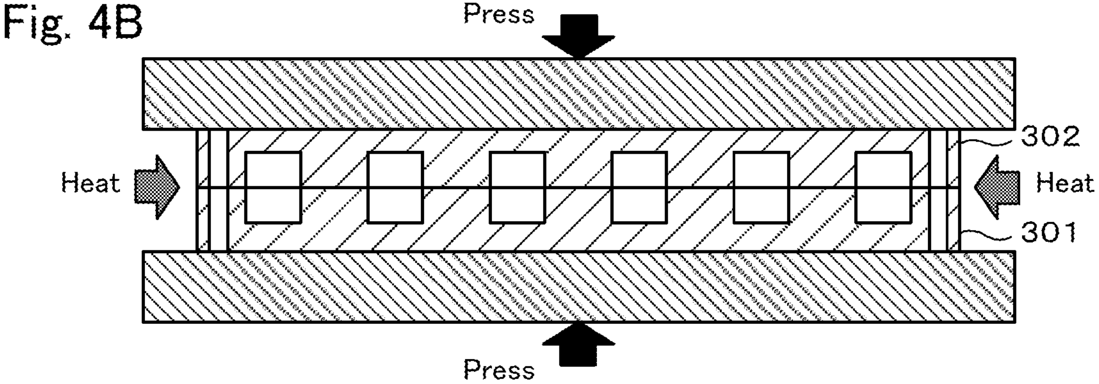
Figure 4C:
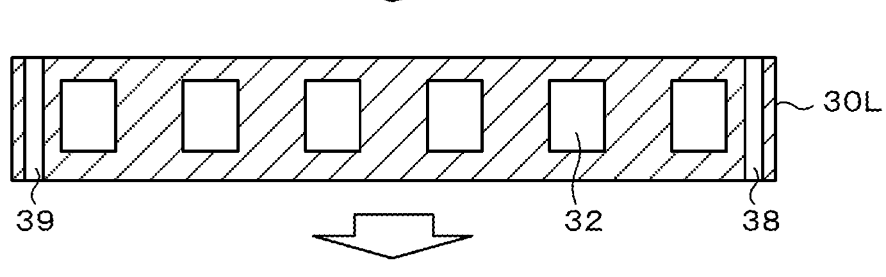

Subsequently, the first cooling plate layer 301 and the second cooling plate layer 302 are stacked such that the upper surface of the first cooling plate layer 301 and the lower surface of the second cooling plate layer 302 are in contact with each other to obtain a layered body. The obtained layered body is heated at a predetermined temperature lower than or equal to the melting point of the base material of the first cooling plate layer 301 and the second cooling plate layer 302 while being pressed upward and downward to diffusion-bond the first cooling plate layer 301 and the second cooling plate layer 302 (FIG. 4B). Thus, the surfaces, in contact with each other, of the first cooling plate layer 301 and the second cooling plate layer 302 are joined to each other such that the metals forming the layers are atomically joined to each other to obtain a lower cooling plate layer 30L (FIG. 4C). The lower cooling plate layer 30L has the refrigerant passage 32, which is formed by the two refrigerant passage grooves 321 and 322, the gas supply passage 38, which is formed by the two through holes 381 and 382, and the gas discharge passage 39, which is formed by the two through holes 391 and 392.

Figure 4D:
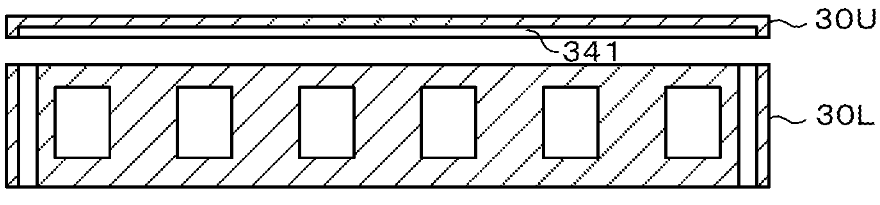
Figure 4E:
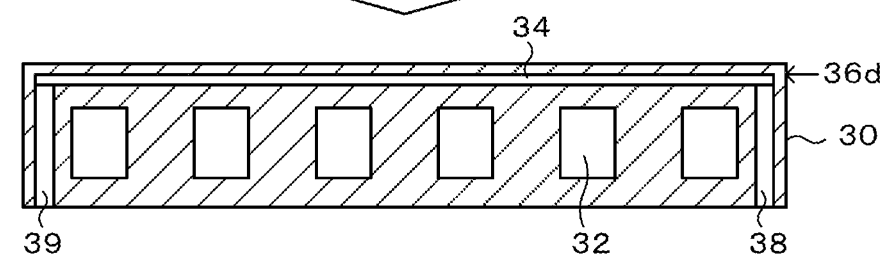

Subsequently, an upper cooling plate layer 30U, which is a metal disc, is prepared, and a recessed groove 341, which has a circular shape in plan view, is formed in a lower surface of the upper cooling plate layer 30U (FIG. 4D). Then, the lower cooling plate layer 30L and the upper cooling plate layer 30U are stacked such that an upper surface of the lower cooling plate layer 30L and the lower surface of the upper cooling plate layer 30U are in contact with each other to obtain a layered body. The obtained layered body is heated at a predetermined temperature lower than or equal to the melting point of the base material of the lower cooling plate layer 30L and the upper cooling plate layer 30U while being pressed upward and downward to diffusion-bond the lower cooling plate layer 30L and the upper cooling plate layer 30U. Thus, the surfaces, in contact with each other, of the lower cooling plate layer 30L and the upper cooling plate layer 30U are joined to each other such that the metals forming the layers are atomically joined to each other to obtain the cooling plate 30 (FIG. 4E). The cooling plate 30 has the space layer 34, which is formed by the recessed groove 341 and the upper surface of the lower cooling plate layer 30L. In addition, the seam **36*d*** is formed by metal bonding.

The lower surface of the ceramic plate 20 manufactured separately is joined, via an adhesive sheet, to the upper surface of the cooling plate 30 obtained in this manner to obtain the wafer placement table 10.

Next, an example of using the wafer placement table 10 will be described. The wafer placement table 10 is fixed to the inside of a semiconductor process chamber (not illustrated). The wafer W is placed on the wafer placement portion 22. In this state, a direct-current voltage is applied to the electrostatic electrode 24 to attract the wafer W to the wafer placement portion 22. Simultaneously, a refrigerant circulates in the refrigerant passage 32. In addition, electric power is supplied to the heater electrode 26. Thus, the heater electrode 26 generates heat to heat the wafer W. Then, the inside of the chamber is set to have a predetermined vacuum atmosphere, and an RF voltage is applied to the cooling plate 30 while a process gas is supplied from a shower head provided on a ceiling portion of the chamber. Then, plasma is generated between the wafer W and the shower head. Such plasma is used to perform CVD or etching on the wafer W. Filling a heat conductive gas in the space layer 34 to reduce the thermal resistance and providing a vacuum atmosphere in the space layer 34 to increase the thermal resistance are switched as appropriate depending on the conditions.

Figure 5:
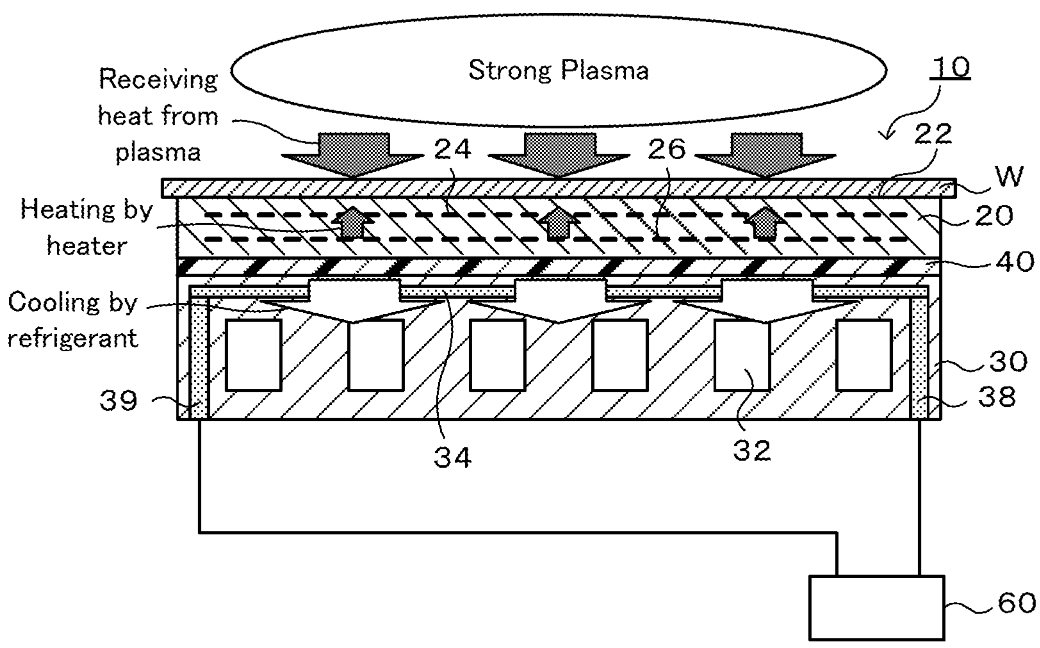
FIG. 5 is a diagram illustrating an example of using the wafer placement table 10 when strong plasma is generated.

For example, as illustrated in FIG. 5, when the plasma generated above the wafer W is strong plasma, the fluid switching mechanism 60 is controlled such that a heat conductive gas is filled in the space layer 34. Thus, the thermal resistance between the refrigerant passage 32 and the upper surface of the cooling plate 30 is reduced. In this case, the wafer W receives a relatively large amount of heat from the strong plasma. Accordingly, the refrigerant flowing in the refrigerant passage 32 is required to cool the wafer W so that the wafer W has a predetermined temperature. Since the thermal resistance between the refrigerant passage 32 and the upper surface of the cooling plate 30 is reduced, it is possible to cool the wafer W smoothly. Temperature control by a refrigerant is not responsive. Thus, when the temperature of the wafer W is lower than the predetermined temperature, the wafer W is finely adjusted so as to have the predetermined temperature with the heater electrode 26.

Figure 6:
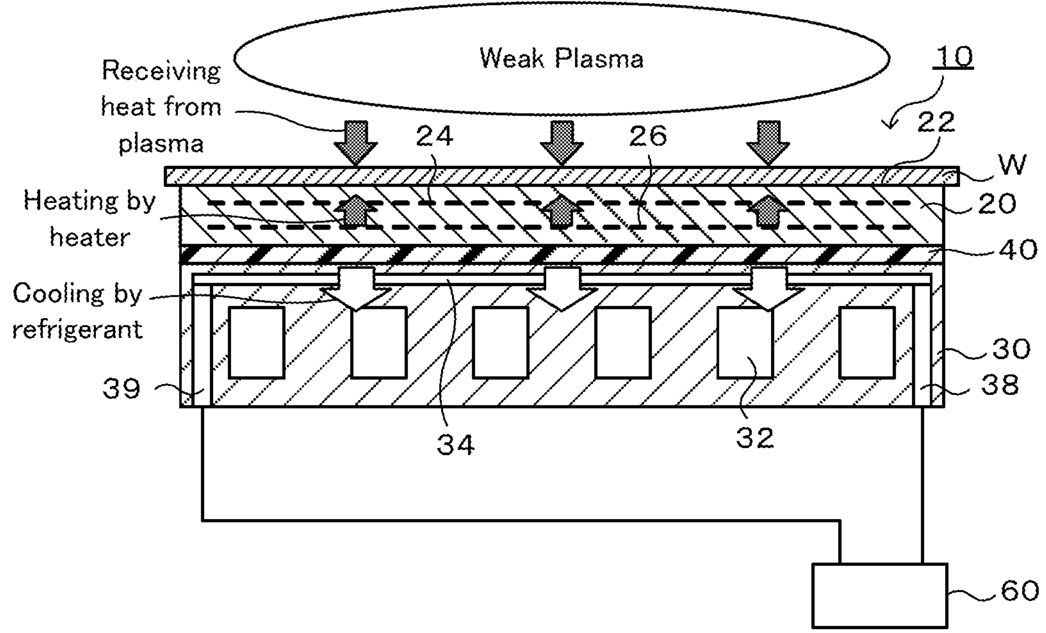
FIG. 6 is a diagram illustrating an example of using the wafer placement table 10 when weak plasma is generated.

On the other hand, as illustrated in FIG. 6, when the plasma generated above the wafer W is weak plasma, the fluid switching mechanism 60 is controlled such that the space layer 34 has a vacuum atmosphere. Thus, the thermal resistance between the refrigerant passage 32 and the upper surface of the cooling plate 30 is increased. In this case, the wafer W receives a relatively small amount of heat from the weak plasma. Accordingly, the refrigerant flowing in the refrigerant passage 32 is required to cool the wafer W so that the wafer W has the predetermined temperature. Since temperature control by a refrigerant is not responsive, the wafer W may be cooled excessively. In this case, since the thermal resistance between the refrigerant passage 32 and the upper surface of the cooling plate 30 is increased, the temperature of the wafer W is not reduced excessively by the refrigerant. Also in this case, the wafer W is finely adjusted so as to have the predetermined temperature with the heater electrode 26. However, the amount of heat generated by the heater electrode 26 is smaller than that in a case in which the space layer 34 is not provided.

In the wafer placement table 10 described above, the space layer forming portion 36, which surrounds the space layer 34, of the cooling plate 30 has the seam **36*d*. The seam 36*d* is formed by metal bonding without a seal member. Thus, even when the wafer placement table 10 is used for a long time, it is possible to inhibit leakage of a gas from the seam 36*d* of the space layer forming portion 36**.

In addition, the space layer 34 covers the whole of the refrigerant passage 32 in plan view. Thus, the cooling efficiency of the refrigerant passage 32 is more easily controlled by using the space layer 34 than that in a case in which the space layer 34 covers a part of the refrigerant passage 32 in plan view.

Furthermore, the fluid switching mechanism 60 switches between supply of a gas to the space layer 34 and discharge of a gas from the space layer 34, thus enabling a reduction and an increase in the thermal resistance of the space layer 34.

Furthermore, when the plasma generated above the wafer W is strong plasma, a heat conductive gas is filled in the space layer 34, thus improving the efficiency of cooling the wafer W with a refrigerant. On the other hand, when the plasma generated above the wafer W is weak plasma, the space layer 34 has a vacuum atmosphere, thus inhibiting the wafer W from being cooled with a refrigerant. Accordingly, it is possible to adjust the temperature of the wafer W to the predetermined temperature with a small amount of heat generated by the heater electrode 26. As a result, it is possible to reduce unnecessary electric power consumption.

The present invention is not limited to the above embodiment. Needless to say, various embodiments can be implemented within the technical scope of the present invention.

Figure 7A:
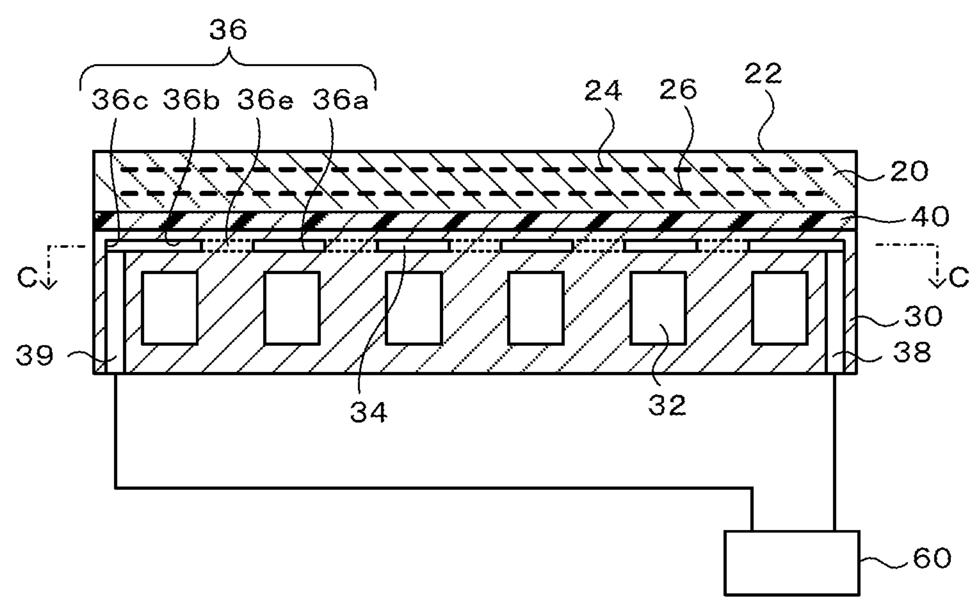
FIGS. 7A and 7B include diagrams when columnar members 36*e* are provided in the above embodiment.
Figure 7B:
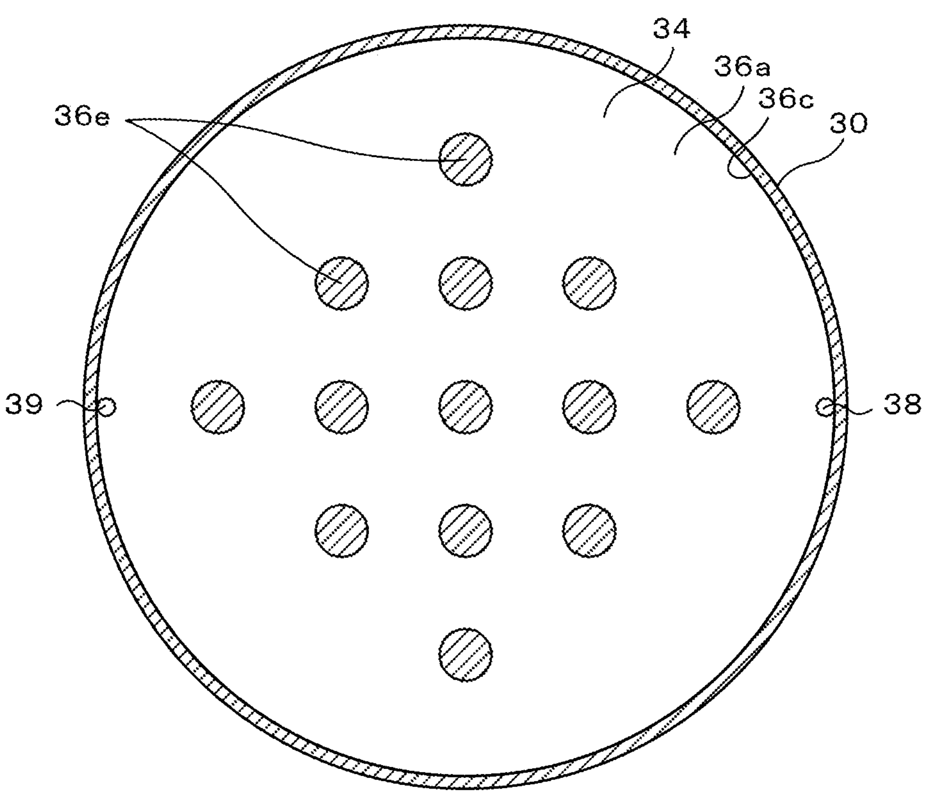

In the above embodiment, as illustrated in FIGS. 7A and 7B, a plurality of columnar members **36*e*, which connect the ceiling surface 36*b* and the bottom surface 36*a* of the space layer forming portion 36, may be provided in the space layer 34. FIG. 7A is a vertical cross-sectional view of the wafer placement table. FIG. 7B is a sectional view taken along C-C in FIG. 7A. In FIGS. 7A and 7B, the same components as those in the above embodiment have the same reference signs. In this manner, the thermal resistance of the space layer 34 in an up-down direction is smaller than that in the above embodiment (case including no columnar members 36*e*), thus enabling heat of the wafer W to be efficiently dissipated into the refrigerant passage 32. This is because the thermal conductivity of the columnar member 36*e* is higher than the thermal conductivity of a heat conductive gas. In this case, the area percentage of all the columnar members 36*e* to the space layer 34 in plan view is preferably 50% or less. This is because a sufficient thermal insulation effect (effect of increasing the thermal resistance) of the space layer 34** having a vacuum atmosphere cannot be achieved in some cases when this area percentage is more than 50%.

Figure 8A:
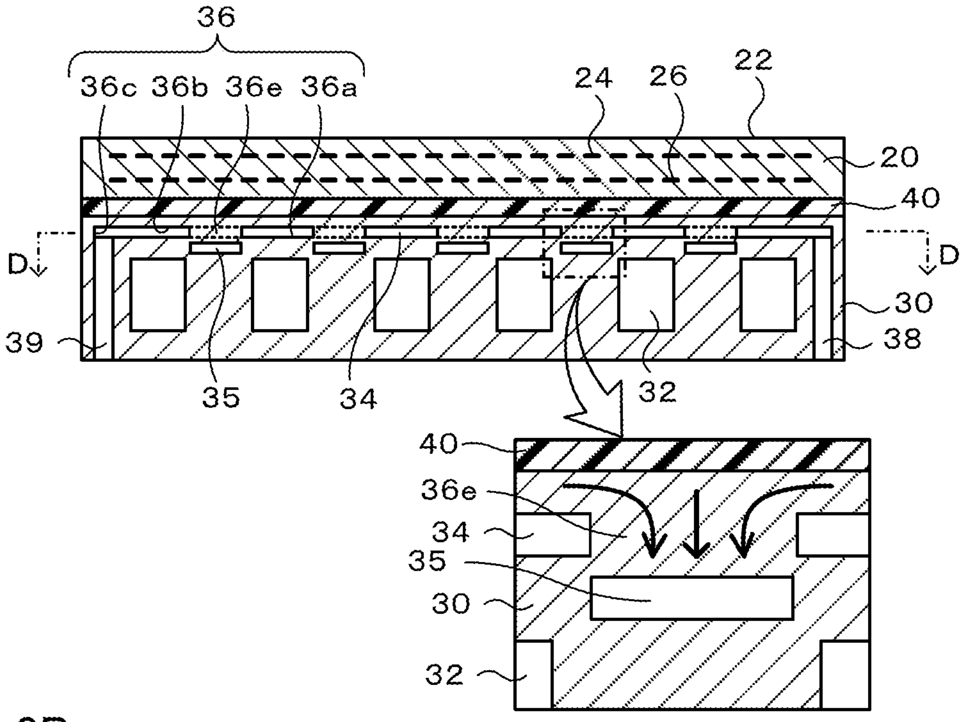
FIGS. 8A and 8B include diagrams when the columnar members 36*e* and hollow portions 35 are provided in the above embodiment.
Figure 8B:
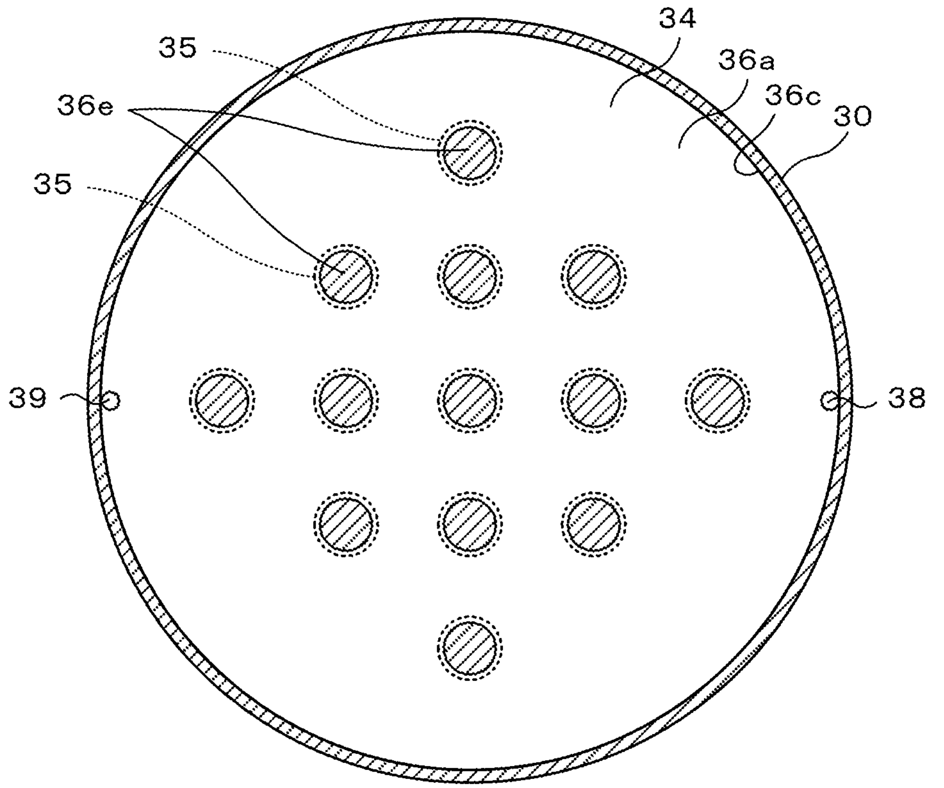

When the above embodiment includes the columnar members **36*e*, as illustrated in FIGS. 8A and 8B, hollow portions 35, which are different from the space layer 34, may be provided at respective positions in the cooling plate 30 that are located directly below the columnar members 36*e*. FIG. 8A is a vertical cross-sectional view of the wafer placement table. FIG. 8B is a sectional view taken along D-D in FIG. 8A. In FIGS. 8A and 8B, the same components as those in the above embodiment have the same reference signs, but the fluid switching mechanism 60 is not illustrated. Since the columnar members 36*e* connect the ceiling surface 36*b* and the bottom surface 36*a* of the space layer forming portion 36, respective parts of the wafer W that are located directly above the columnar members 36*e* may be cooled excessively. However, in this case, since the hollow portions 35 (circular hollows in plan view), which are different from the space layer 34, are provided at the respective positions in the cooling plate 30 that are located directly below the columnar members 36*e*, the thermal insulation effect of the hollow portions 35 is capable of inhibiting the respective parts of the wafer W that are located directly above the columnar members 36*e* from being cooled excessively. A partial enlarged view in FIG. 8A schematically illustrates heat flows represented by arrows. The heat flows are blocked by the hollow portion 35. The hollow portions 35 may be provided at respective positions in the cooling plate 30 that are located directly above the columnar members 36*e* instead of being provided at the respective positions in the cooling plate 30 that are located directly below the columnar members 36*e***.

Figure 9A:
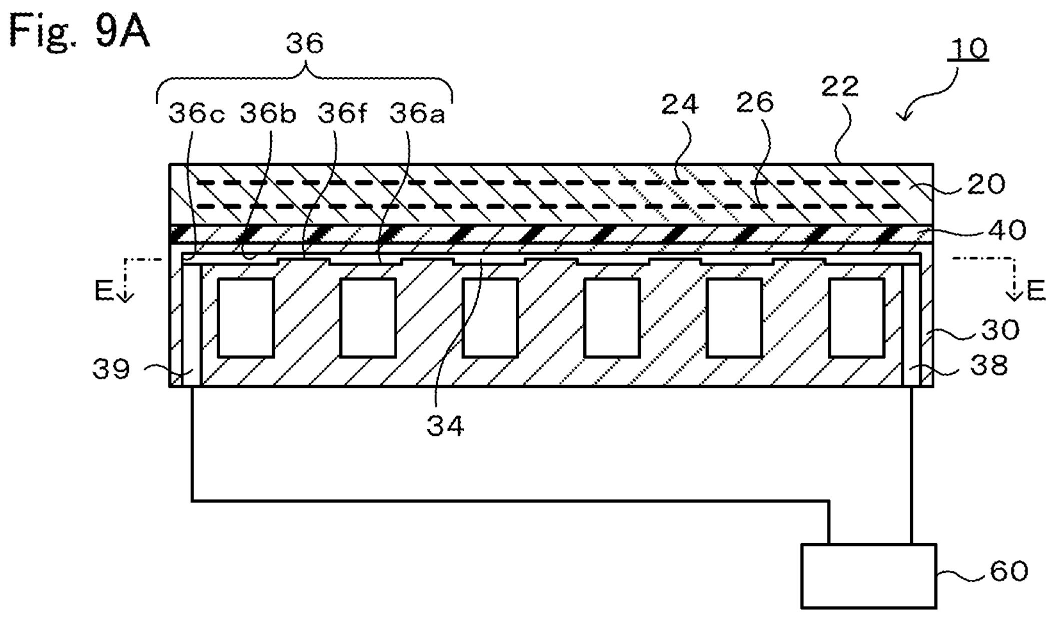
FIGS. 9A and 9B include diagrams when projecting portions 36*f* are provided in the above embodiment.
Figure 9B:
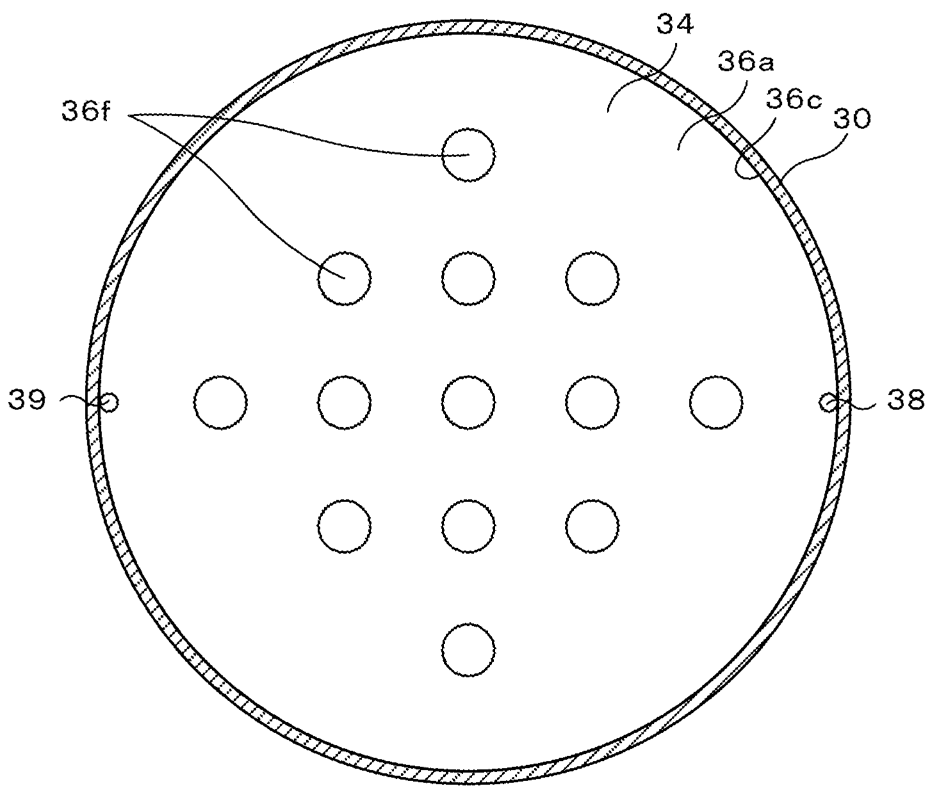

In the above embodiment, as illustrated in FIGS. 9A and 9B, a plurality of projecting portions **36*f*, whose height is smaller than the height (thickness) of the space layer 34, may be provided, in the space layer 34, on the bottom surface 36*a* of the space layer forming portion 36. FIG. 9A is a vertical cross-sectional view of the wafer placement table. FIG. 9B is a sectional view taken along E-E in FIG. 9A. In FIGS. 9A and 9B, the same components as those in the above embodiment have the same reference signs. In this manner, the thermal resistance of the space layer 34 in an up-down direction is smaller than that in the above embodiment (case including no such projecting portions 36*f*), thus enabling heat of the wafer W to be efficiently dissipated into the refrigerant passage 32. On the other hand, the projecting portions 36*f* do not connect the ceiling surface 36*b* and the bottom surface 36*a* of the space layer forming portion 36. Thus, it is also possible to achieve a sufficient thermal insulation effect of the space layer 34 having a vacuum atmosphere. The projecting portions 36*f* may be provided on the ceiling surface 36*b* instead of being provided on the bottom surface 36*a***.

Figure 10:
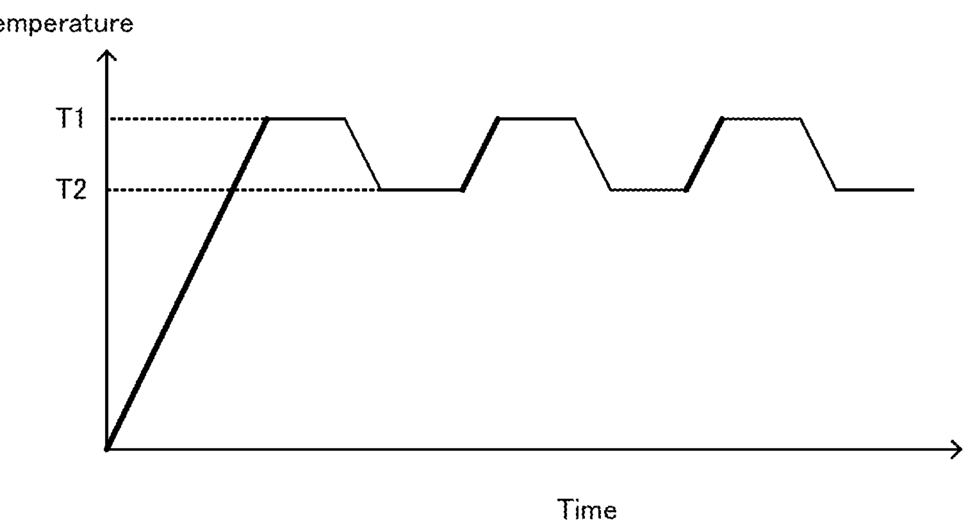
FIG. 10 is a graph illustrating the relationship between time and the temperature of a wafer W in a process of processing the wafer W.

An example in which filling a heat conductive gas in the space layer 34 and providing a vacuum atmosphere in the space layer 34 are switched depending on the intensity of plasma is illustrated in the above embodiment, but the present invention is not particularly limited thereto. For example, in a process of processing the wafer W, the temperature of the wafer W is increased and reduced repeatedly, and a vacuum atmosphere may be provided in the space layer 34 at the time of a temperature increase. FIG. 10 is a graph illustrating the relationship between time and the temperature of the wafer W in a process of processing the wafer W. In this case, the space layer 34 is set to have a vacuum atmosphere at the beginning of the process and is kept having the vacuum atmosphere until the temperature of the wafer W is increased to T1, and a heat conductive gas is supplied to and filled in the space layer 34 at the time when the temperature of the wafer W reaches T1. Then, the temperature of the wafer W is kept at T1 for a predetermined time and is thereafter reduced to T2 (<T1). Thereafter, the state in which the heat conductive gas is filled in the space layer 34 is kept while the temperature of the wafer W is kept at T2 for a predetermined time. Thereafter, the space layer 34 is set to have the vacuum atmosphere and is kept having the vacuum atmosphere while the temperature of the wafer W is increased from T2 to T1. The space layer 34 is set to have the vacuum atmosphere in thick line sections (temperature increase sections) of a line graph in FIG. 10. Thus, when the temperature of the wafer W is increased, heat is less likely to be taken away by the refrigerant passage 32, thus enabling the temperature of the wafer W to be increased rapidly.

In the above embodiment, a gas can be supplied to the space layer 34. However, a liquid may be supplied to the space layer 34 instead of such a gas. For example, the same refrigerant as that to flow in the refrigerant passage 32 is usable as such a liquid.

In the above embodiment, in the state in which a heat conductive gas is filled in the space layer 34, the thermal resistance of the space layer 34 in an up-down direction may be larger than the thermal resistance of the joining layer 40 in the up-down direction. Thus, it is possible to inhibit excessive heat conduction even when a heat conductive gas is filled in the space layer 34 to promote heat conduction between the refrigerant passage 32 and the upper surface of the cooling plate 30. In particular, such a configuration may be preferably applied when a metal joining layer or a highly heat conductive adhesive layer is used as the joining layer 40. Alternatively, in the state in which a heat conductive gas is filled in the space layer 34, the thermal resistance of the space layer 34 in an up-down direction may be smaller than the thermal resistance of the joining layer 40 in the up-down direction. Thus, it is possible to further promote heat conduction between the refrigerant passage 32 and the upper surface of the cooling plate 30 when a heat conductive gas is filled in the space layer 34 to promote the heat conduction.

In the above embodiment, the numbers of the gas supply passages 38 and the gas discharge passages 39 provided in the cooling plate 30 are one each but are not particularly limited thereto. For example, a plurality of gas supply passages 38 may be provided along a circumference concentric with the cooling plate 30. Thus, a gas is easily supplied uniformly to the space layer 34.

In the above embodiment, a heat conductive gas may circulate in the space layer 34 to cool the wafer W efficiently. Thus, the space layer 34 is usable as a refrigerant passage.

In the above embodiment, a disc member made of a metal is illustrated as the cooling plate 30, but the cooling plate 30 is not particularly limited thereto. For example, the cooling plate 30 may be a disc member made of a metal-ceramic composite. Examples of such a metal-ceramic composite include a metal matrix composite (MMC) and a ceramic matrix composite (CMC). Specific examples of such composites include a material containing Si, SiC, and Ti, a material formed by impregnating a SiC porous body with Al and/or Si, and an $Al_2O_3$—TiC composite.

In the above embodiment, the refrigerant passage 32 has a volute shape in plan view, but the shape of the refrigerant passage 32 is not particularly limited thereto. For example, the refrigerant passage 32 may have a zigzag shape in plan view.

In the above embodiment, an electrostatic electrode and a heater electrode are illustrated as the electrodes incorporated in the ceramic plate 20, but the electrodes incorporated in the ceramic plate 20 are not particularly limited thereto. For example, the ceramic plate 20 may incorporate an RF electrode in addition to these electrodes.

In the above embodiment, the wafer placement table 10 may have a lift pin hole into which a lift pin for lifting the wafer W from the wafer placement portion 22 can be inserted, and the backside of the wafer W may have a gas hole through which a backside gas is supplied.

In the above embodiment, the heater electrode 26 is provided in a region corresponding to substantially the entire upper surface of the ceramic plate 20. However, the region corresponding to substantially the entire upper surface of the ceramic plate 20 may be divided into a plurality of respective zones in which heater electrodes are provided.

International Application No. PCT/JP2022/042044, filed on Nov. 11, 2022, is incorporated herein by reference in its entirety.

What is claimed is:

1. A wafer placement table comprising:

a ceramic plate having a wafer placement portion at an upper surface of the ceramic plate and incorporating an electrode;

a cooling plate joined to a lower surface of the ceramic plate and having a refrigerant passage;

a space layer provided between the refrigerant passage and an upper surface of the cooling plate; and a space layer forming portion, surrounding the space layer, of the cooling plate, wherein the space layer forming portion has a seam, and the seam is formed by metal bonding without a seal member, wherein a plurality of columnar members connecting a ceiling surface and a bottom surface of the space layer forming portion are provided in the space layer, and wherein hollow portions different from the space layer are provided at respective positions in the cooling plate that are located directly above or directly below the columnar members.

2. The wafer placement table according to claim 1, wherein the space layer covers a whole of the refrigerant passage in plan view.

3. The wafer placement table according to claim 1, wherein a plurality of projecting portions whose height is smaller than a thickness of the space layer are provided, in the space layer, on at least one of a ceiling surface or a bottom surface of the space layer forming portion.

4. The wafer placement table according to claim 1, further comprising a fluid switching mechanism connected to the space layer, the fluid switching mechanism being capable of switching between supply of a fluid to the space layer and discharge of the fluid from the space layer.

* * * * *